United States Patent [19]

Baron et al.

[11] Patent Number: 5,599,444
[45] Date of Patent: Feb. 4, 1997

[54] APPARATUS FOR REMOVING RESIST PARTICLES FROM STRIPPING SOLUTIONS FOR PRINTED WIREBOARDS

[75] Inventors: David T. Baron, Worcestershire; Alexander R. Taylor, Ayrshire; Kuldip S. Johal, Willenhall, all of England

[73] Assignee: Atotech USA, Inc., Somerset, N.J.

[21] Appl. No.: 413,760

[22] Filed: Mar. 30, 1995

Related U.S. Application Data

[62] Division of Ser. No. 207,991, Mar. 8, 1994, Pat. No. 5,531,889.

[51] Int. Cl.⁶ .......................... B01D 29/90; B01D 33/72; C23F 1/00; H01L 21/3105
[52] U.S. Cl. .......................... 210/167; 210/196; 210/405; 210/456; 134/10; 134/42; 216/93; 156/642.1
[58] Field of Search .................................. 210/167, 767, 210/780, 784, 805, 774, 167, 196, 405, 416.1, 456; 134/10, 13, 38, 40, 42; 216/93; 156/642.1, 643.1, 75, 631.1, 659.11

[56] References Cited

U.S. PATENT DOCUMENTS

| | | |
|---|---|---|
| 2,317,430 | 4/1943 | Ayens . |
| 2,825,462 | 3/1958 | Hackney . |
| 2,905,323 | 9/1959 | Megesi . |
| 3,043,432 | 7/1962 | Megesi . |
| 3,744,995 | 7/1973 | MacKay . |
| 3,782,555 | 1/1974 | Solum . |
| 3,792,845 | 2/1974 | Larson et al. . |
| 3,833,123 | 9/1974 | Walker . |
| 4,008,154 | 2/1977 | Richards . |
| 4,046,156 | 9/1977 | Cook . |
| 4,113,626 | 9/1978 | Detcher . |
| 4,202,777 | 5/1980 | Schall . |
| 4,240,617 | 12/1980 | MacKay . |
| 4,325,732 | 4/1982 | Woog . |
| 4,371,422 | 2/1983 | Eidschun . |
| 4,430,210 | 2/1984 | Tuuha . |
| 4,441,697 | 4/1984 | Peterson . |
| 4,608,177 | 8/1986 | Woog . |
| 4,661,253 | 4/1987 | Williams . |
| 4,662,613 | 5/1987 | Woog . |
| 4,760,014 | 7/1988 | Wong . |
| 4,784,169 | 11/1988 | Striedieck . |
| 4,857,206 | 8/1989 | Choo . |
| 4,867,879 | 9/1989 | Muller . |
| 4,921,571 | 5/1990 | Kukanskis et al. . |
| 4,988,448 | 1/1991 | Woog . |
| 4,999,114 | 3/1991 | Choo . |
| 5,017,267 | 5/1991 | Cordani . |
| 5,026,029 | 6/1991 | Peterson . |
| 5,178,759 | 1/1993 | Gurrian . |
| 5,211,843 | 5/1993 | Wester . |
| 5,232,460 | 8/1993 | Botz . |
| 5,248,382 | 9/1993 | Soukup . |
| 5,531,889 | 7/1996 | Baron . |

FOREIGN PATENT DOCUMENTS

| | | |
|---|---|---|
| 441210 | 8/1991 | European Pat. Off. . |
| 660580 | 5/1938 | Germany . |
| 3638371 | 5/1988 | Germany . |
| 4012950 | 10/1991 | Germany . |
| 2050855 | 1/1981 | United Kingdom . |
| 2061748 | 5/1981 | United Kingdom . |

*Primary Examiner*—Thomas M. Lithgow
*Attorney, Agent, or Firm*—Stanley A. Marcus

[57] ABSTRACT

An apparatus for removing polymer particles from the stripping solution used in the treatment of printed wireboards comprises passing a solution having resist particles dispersed therein over a screen having openings of 100 microns, where the screen is maintained at an angle of from 40 to 70° to the horizontal. The apparatus comprises a curtain tube consisting of an inner concentric tube with a plurality of holes and an outer concentric tube with a slot wherein the position of the slot is adjustable, a filter comprising a screen, and a pump for circulating the solution. In one embodiment, the filter comprises a cylindrical screen.

The stripping solution comprises an aqueous solution of an organoamine, ionic nitrogen compound or alkali or alkaline-earth hydroxide, or mixtures thereof.

20 Claims, 3 Drawing Sheets

APPARATUS FOR REMOVING RESIST PARTICLES FROM STRIPPING SOLUTIONS FOR PRINTED WIREBOARDS

This is a divisional of application Ser. No. 08/207,991 filed on Mar. 8, 1994, now U.S. 5,531,889.

BACKGROUND OF THE INVENTION

1. Field of the Invention

This invention is in the field of methods and apparatus for the separation of particles from the liquid in which they are carried. More particularly, the present invention is in the field of method and apparatus for removing particulate polymer from the stripping solutions used in the processing of a printed wireboard (PWB).

2. Description of the Prior Art

Apparatus of the prior art for processing a PWB comprises means for coating a supported copper sheet with a photopolymer, or photoresist, material known as "resist", exposing the coated sheet to radiation to produce a pattern, developing the pattern on the resist, removing the undeveloped portions, etching the exposed copper, and stripping the remaining resist potions by contacting the treated PWB to the action of a stripping medium, whereby a dispersion of resist in the stripping medium is produced.

The stripping solution is used to remove resist from a PWB in order to leave a circuit pattern of desired configuration; the stripping solution must thereafter either be discarded, or the resist removed from it in order to permit re-use of the solution. Economics would appear to dictate the latter, but in the present state of the art, simply filtering the liquid generally requires changing or otherwise dealing with the filter medium and apparatus employed, with attendant problems of plugging, maintenance and disposal. Further, filtration of the particulate-containing stripping solution to effect the desired separation has heretofore been both time-consuming and labor-intensive, and thus of borderline economy.

The method presently in general use for the separation of resist particles from stripping comprises the use of a hydrocyclone filter, in which the solution is pumped through a cone which causes the liquid to spin, thereby imputing a centrifugal force, which effects a separation, by filtration through a screen, of about 40% of the resist particles from the solution. The resist particles not removed by the filtration, together with the filtered solution, are recycled to the stripping operation. The retained particles are removed from the filtration screen by any convenient means, such as scraping or hydraulic flushing, followed by disposal.

The retention of the majority of the particles in the filtered solution causes a progressive diminution of the efficiency of the solution to act as a resist-stripping agent, and results in the necessity for relatively frequent replacement of the filtered solution with fresh material, on an approximately weekly or more-frequent basis. This replacement of stripping solution is generally accompanied by shutting down the PWB production line, and is thus undesirable in terms of lost production time and non-productive labor cost.

A number of other approaches to the problem of separating the stripped resist from the stripping solutions are found in the prior art. Wong, in U.S. Pat. No. 4,760,014, describes apparatus for production and stripping of PWB; he teaches the addition of an acid to the resist-stripper solution in order to coagulate the resist into substantially non-tacky discrete particles which can then be removed from the liquid phase with relative economy, and with proper disposal then made of the respective portions of the stream. It is noted that the treatment method of Wong requires disposition of the stripper solution due to its altered condition after the separation step.

In a more general solid-liquid separation device described in U.S. 4,661,253, Williams provides the separation of animal waste from an aqueous carrier stream by allowing the carrier stream to flow over a screen maintained at an angle of substantially 60° to the horizontal, while a high-pressure, oscillating water spray impinges on the lower surface of the screen and prevents clogging of the screen holes with particulates.

In U.S. 4,626,349, Uphus provides physical separation of liquids and solids by causing a carrier stream having solids dispersed therein to flow over a screen capable of varying angular inclination to the horizontal. Uphus provides an inverted funnel and baffle means to decrease the rate of the carrier stream and to distribute its flow to the screen in a substantially laminar fashion. The apparatus has no means for recirculation of the separated liquid to the process wherein that liquid became associated with the solids from which the Uphus apparatus separates it.

Walker, in U.S. Pat. No. 3,833,123, discloses apparatus having an inclined screen to effect separation of a carrier stream into its solid and liquid components, and includes baffles to release the boundary flow of the filtrate from surface-tension forces and to cause the filtrate to fall away from the lower surface of the screen. In a fashion similar to the Williams device, Walker uses a spray to reduce the tendency of the screen to clog. None of the prior-art teachings disclose a mechanism for minimizing the dwell time of the process.

SUMMARY OF THE INVENTION

This invention comprises method and apparatus for the continuous separation of particulates from a liquid dispersion thereof which comprises passing the dispersion through mixing and dispensing means and thereafter contacting the dispersion with separation means adapted to separate the particulates from the liquid, and recovering the liquid.

DESCRIPTION OF THE PREFERRED EMBODIMENTS

Figures 1, 2:
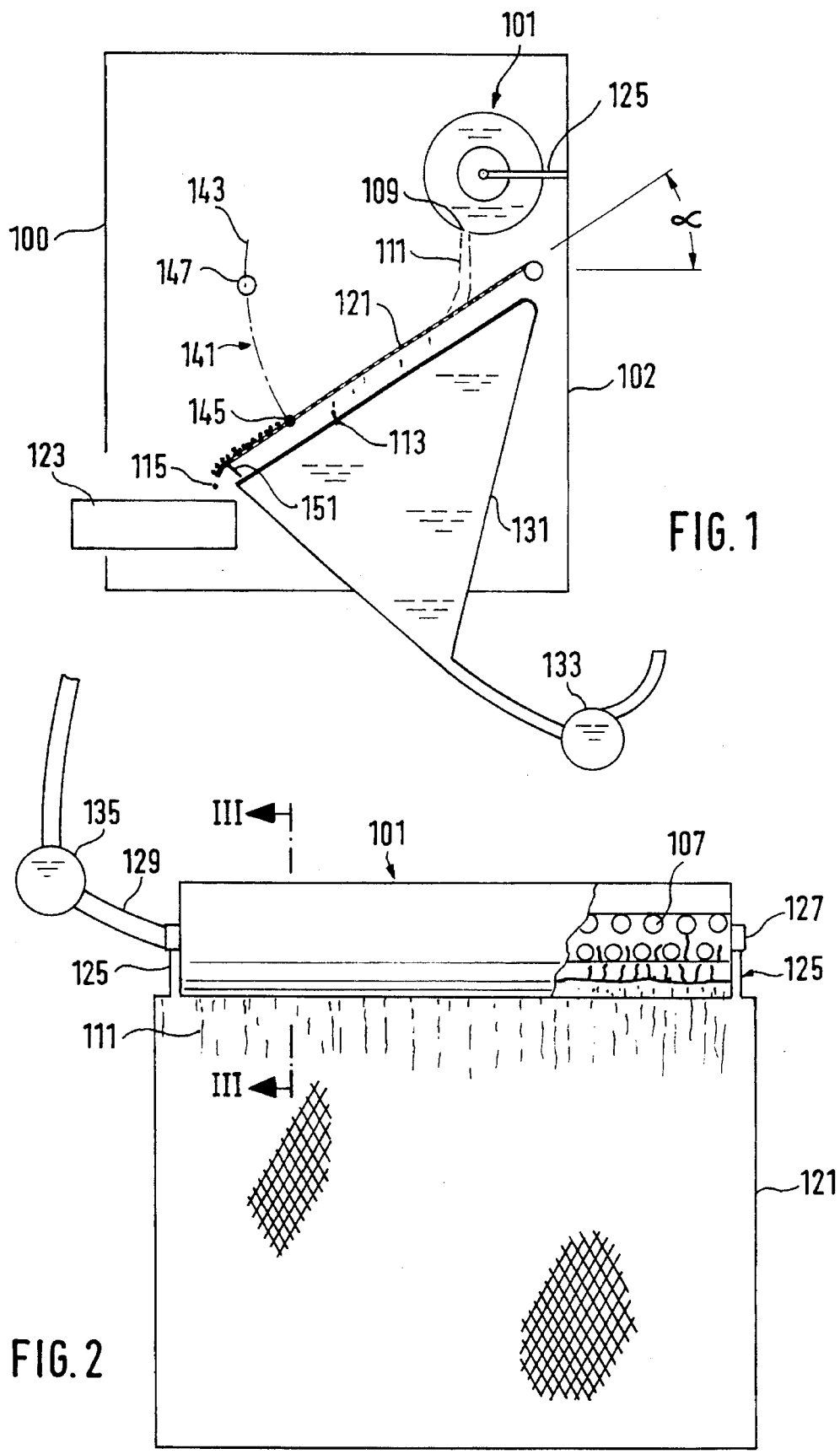
FIG. 1 is a side elevation of the apparatus of the present invention.
FIG. 2 is a front elevation of the curtain tube and the screen of the invention.

The preferred embodiment of this invention comprises method and means for the separation of particulate matter, following the resist-stripping step, from a stripping solution carrying resist particles from operations for the production of PWBs.

The preferred method of the invention comprises the separation of resist particles from a stripping medium, by contacting a PWB with the stripping medium to effect removal of the resist, passing the stripping medium containing resist particles over a screen, thereby separating the resist particles from the solution, and thereafter recirculating the stripping solution to the contacting step, wherein the resist particles are subject to a minimal dwell time in the stripping medium: "dwell time" is defined as the time during which the particulate materials, and specifically resist particles encountered in stripping PWBs, are in contact with the solvent.

The stripping medium comprises an aqueous solution containing one or more compounds selected from the group consisting of (1) at least one organoamine having the general molecular formula $(R_kN)_nC_qR_m$, where k is 1 or 2, n and m are integers from 1 to about 5, q is an integer from zero to about 5, R is hydrogen or hydroxyl, or substituted or unsubstituted alkyl, aryl or aralkyl of from 1 to about 10 carbon atoms, each R group in the molecule can be the same or different, there is at least one carbon-hydroxyl group in the molecule and the carbons are not necessarily catenated; (2) an ionic nitrogen compound having the general formula $[N_yR'_w]^+[A]^-$, where y is an integer from 1 to about 3, w is an integer from 4 to about 8, R' is hydrogen or hydroxyl, or substituted or unsubstituted alkyl, aryl or aralkyl of from 1 to about 10 carbon atoms, where substituents on the R' groups include halogen, hydrogen, hydroxyl and oxygen, and nitrogen- and sulfur-containing moieties, each R group can be the same or different, and A is anionic; and (3) alkali-metal and alkaline-earth hydroxides.

The preferred apparatus of the present invention comprises means for contacting a treated printed wire board with a stripping solution, solution-movement means, mixing and dispensing means, filtration means, particle-storage means, and recirculation means. The solution-movement means generally comprises a pump or the like; the mixing and dispensing means preferably comprises a curtain tube consisting of an inner concentric tube with a plurality of holes, and an outer concentric tube having a slot wherein the position of the slot is adjustable. The filtration means can comprise a stationary, generally flat, screen adjustable with respect to the horizontal, or a rotating, generally cylindrical, screen, where the screen openings are from about 60 to about 150 μ. The recirculation means generally comprise a suitable pump for returning the stripping solution to the step of stripping the cured resist from the treated PWB.

Another embodiment of the present invention is apparatus comprising, in combination, apparatus for preparing and stripping a PWB, that apparatus having affixed thereto and in communication therewith apparatus for the continuous removal of stripped resist particles wherein the apparatus for removal comprises solution-movement means juxtaposed and in fluid connection with mixing and dispensing means, preferably a curtain tube, whereby liquid passing through the mixing and dispensing means impinges on separation means, preferably a screen, to effect separation of particulates from the stripping solution by passage of the stripping solution over and through the separation means, wherein the stripping solution with resist particles removed therefrom is collected in collecting means adjacent the separation means, the combination apparatus further having recirculation means adapted to return the collected stripping solution, from which resist particles have been removed, to the apparatus for preparing and removing resist from the PWB.

Preferred stripping media include aqueous solutions of ethylene diamine tetraacetic acid (EDTA), tetramethyl ammonium hydroxide, choline, and derivatives thereof, where the derivatives include, e.g., esters, ethers, thiols, halogen-containing groups, and the like. Most-preferred stripping media are alkanolamines, specifically methanolamine, ethanolamine, dimethanol amine, diethanol amine, trimethanol amine, triethanol amine, and $HO.C_2H_4.NH.C_2H_4.NH_2$.

A solution or dispersion of from about 1 to about 80 wt % of the organoamine in water is a preferred stripping medium, and from 5 to about 50 wt % is most preferred. The pH of the solution can range from about 9.5 to about 13.5. The stripping step is preferably effected, and the stripping solution maintained, at from about 40 to about 60 degrees Celsius (°C.), and most preferably from about 45 to about 55° C. The term "solution," or "dispersion," as used in this specification, means any combination of a material dissolved in a solvent, a suspension of fine particles carried mechanically in a liquid, or a suspension of fine particles carried mechanically in a liquid also having material dissolved therein.

The method of this invention is conveniently effected with apparatus comprising a curtain tube consisting of an inner concentric tube having a plurality of holes, an outer concentric tube with a slot wherein the position of the slot is adjustable with respect to the vertical, filter means adjustable with respect to the horizontal, means for collection of the filtered resist particles, and means for recycling of the filtered stripping solution, the stripping solution being an aqueous solution with a relatively high pH. The filter means comprises a screen with openings ranging in size from about 60 to about 250 microns (μ), preferably from about 60 to about 150 μ, and most preferably from about 90 to about 120 μ; the screen can be any convenient conformation, but is preferably flat or cylindrical. The adjustable position of the slot is defined herein as the angle with respect to the vertical, formed by a line passing through the centerlines of both the slot and the outer concentric tube.

In the most-preferred embodiment of the present invention, the filter means comprises a stainless-steel screen with openings from about 60 to about 150 μin size, and the most-preferred opening is from about 90 to about 110 μ. The stripping solution comprises an aqueous solution of from 5 to 40 wt % of ethanolamine with about 0.05 wt % of a surfactant; preferred surfactants include ethoxylated tertiary amines having the general formula $R''N[(CH_2CH_2O)_bH]_2$, where R'' is the residue of a fatty acid having from about 6 to about 20 carbon atoms, and each b, which can be the same or different, is from 2 to about 50. The preferred surfactants are nonionic.

In another embodiment of the apparatus of the invention as more fully described hereinbelow, a rotating cylindrical screen is used in cooperation with a resist-removal means to effect separation of resist particles and the stripping solution.

In the operation of this invention, a PWB which has been treated to provide portions of the PWB having resist disposed thereon is treated with a stripping medium as described hereinabove, resulting in a dispersion of resist particles in the stripping medium.

The solution from the stripping step, having resist particles therein, is conveyed to juxtaposed and fluidly connected mixing and dispensing means such as, e.g., a curtain tube, generally by pump means, and passes onto filtration means such as a screen. The filtration means is preferably, but not necessarily, affixed to or integral with the means supporting the mixing and dispensing means, and positioned such that the liquid dispersion from the mixing and dispensing means impinges upon the filtration means, shown in the accompanying drawings as a screen. As the solution proceeds along the screen, the liquid component passes through and over the mesh thereof into juxtaposed storage means such as, e.g., a tray or tank, generally falling under the influence of an applied acceleration, e.g., gravity, into the storage means, leaving the undissolved resist particles on the upper surface of the screen or other filtration and separation means. The liquid in the storage means is then preferably recirculated by connected solution-movement means such as, e.g., a pump, to the stripping step.

By the operation of the method and apparatus of this invention, the stripping medium and the resist particles are in contact for a much shorter period of time than is the case with methods and apparatus of the prior art, i.e., a dwell time of from about 20 seconds (sec.) to about five minutes (min.), and preferably from about 30 sec. to about 2 min. In the prior art, the resist particles may be in contact with the stripping solution for periods ranging from 10 to 30 min. The dissolution of the particles into the stripping medium in the method of the present invention is therefore significantly less, and the stripping solution can be recycled almost indefinitely, subject only to the addition of small amounts of makeup solution as required, in sharp contrast with the limited recycling required with other methods. The term "indefinitely", as used herein, means over 100 cycles of the stripping solution. This in turn provides economy in the use and eventual disposition of the stripping medium, due to the much lower total volume of use of that medium, and is further beneficial to the environment, requiring less disposal of used stripping solution.

Referring now to FIG. 1, apparatus 100 comprises mixing and dispensing means shown as a curtain tube 101 pivotally affixed to frame 102 by support means 125. Solution 111 depends from curtain tube 101 at slot 109, and impinges upon suitably juxtaposed screen 121. Screen 121 is maintained at an angle α to the horizontal, as is discussed more fully hereinbelow. Adjustment means 141 is shown here as rod 143 pivotally affixed to screen 121 at point 145; locking means 147 is conveniently a thumbscrew or equivalent. Other means for adjustment will occur to those skilled in the art; it is sufficient that angle α of screen 121 be capable of modification between about 25 and 85° to the horizontal. In the drawings herein, details such as electrical, mechanical and plumbing connections known or obvious to those skilled in the art are generally not shown, to permit clarity of presentation of the features of the invention.

Solution 111 consists of a dispersion of the stripping solution 113 and resist particles 115 resulting from the processing of PWBs. As solution 111 moves downwardly along screen 121 under the influence of gravity, stripping solution 113 passes through screen 121 and falls into storage means 131. From storage means 131, stripping solution 113 is preferably recycled by pump means 133, but can be optionally discarded or otherwise treated, as the economics of the particular process may dictate. Resist particles 115 continue downwardly along screen 121, and fall into collector 123. From collector 123, resist particles 115 are generally discarded after appropriate treatment to avoid environmental degradation.

Figure 3:
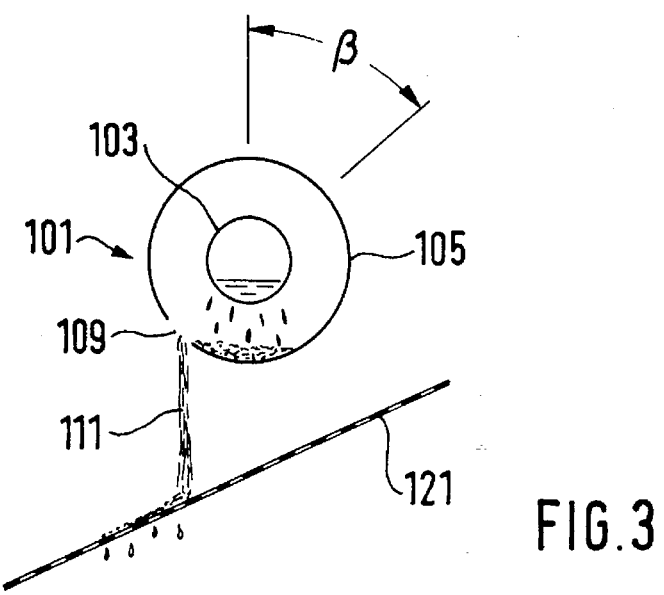
FIG. 3 is a section taken along lines 3—3 of FIG. 2.

FIGS. 2 and 3 show curtain tube 101 consisting of communicating inner concentric tube 103 fastened within outer concentric tube 105, with a plurality of holes 107 in inner tube 103 to provide liquid communication with outer concentric tube 105. Slot 109 is provided in outer concentric tube 105, and runs substantially the length of outer tube 105. Slot 109 is oriented at an angle of from about 45 to about 90° as further described hereinbelos. Curtain tube 101 is pivotally carried on support means 125 at pivot points 127. Solution-feed means 129 is connected with curtain tube 101 conveniently, but not necessarily, at one of the pivot points 127, and serves to provide solution 111 from the resist-stripping step to inner concentric tube 103.

Solution 111 is conveyed through solution-feed means 129 by motive means 135, shown here as a pump juxtaposed in connection with curtain tube 101; solution 111 is conveyed into inner concentric tube 103 of curtain tube 101; the step of conveying the liquid into and through curtain tube 101 both mixes particles 115 thoroughly in solution 111, and causes them to remain in suspension. Solution 111 thus conveyed to curtain tube 101 passes from inner concentric tube 103 into outer concentric tube 105 and thereupon depends from outer concentric tube 105 through slot 109, falling onto suitably juxtaposed screen 121; screen 121 is preferably stainless steel, although any material which is substantially inert to the solution and to the suspended particulates can be used, including, without limitation herein, glass, nylon, high-density polypropylene, and gold. Irrespective of the material of which the screen is made, however, it is a necessary condition that the screen material be wetted by the solution.

Portions of fresh stripping medium can be added as necessary and appropriate in order to maintain or adjust any desired property such as, e.g., pH, temperature or viscosity.

Screen 121 is maintained at an angle α to the horizontal; angle α is preferably from about 35 to about 85°, more preferably from about 40 to about 75°, and most preferably from about 50 to about 55°. Maintenance of the appropriate angle permits solution 111 under the influence of gravity to flow along screen 121 to effect the separation of particles 115 from stripping solution 113, and further to cause particles 115 to proceed downwardly along screen 121 and fall into collector 123 while stripping solution 113 passes through screen 121 into storage means 131.

In FIG. 2, curtain tube 101 is shown partially cut away, with solution 111 flowing from slot 109 onto screen 121. Curtain tube 101 comprises inner tube 103 having holes 107 therein for communication of solution 111 from inner tube 103 to outer tube 105. Solution 111 so flowing is at least partially mixed in inner tube 103, and in flowing from the inner to the outer tube is thoroughly mixed, to provide uniform distribution of particles in the stripper liquid. Solution 111 is thus both mixed and also distributed evenly along the length of curtain tube 101, and flows uniformly through slot 109 of outer tube 105 onto screen 121.

Curtain tube 103 consists of inner tube 103 juxtaposed within and in fluid connection with outer tube 105, and is the functional equivalent of a mixing apparatus wherein solution 111, in movement from the inner to the outer tube, is agitated to maintain dispersion of particles 115. In operation of the apparatus of the invention, pump means 135 urges solution 111 into and through inner tube 103, through holes 107 into outer tube 105 and through slot 109, whereby the mixed solution 111 is dispensed onto screen 121.

As noted hereinabove, the angle α of screen 121 can be adjusted between about 25 and about 85° to the horizontal in order to control flow rate and separation efficacy. Further, the angle β formed by the centerline of slot 109 with the centerline of curtain tube 101 can be adjusted by rotation of curtain tube 101 about pivot points 127, to effect modifications in the force with which solution 111 impinges upon screen 121; those skilled in the art will realize that the rate of flow through pump means 135 can be adjusted contemporaneously. Angle β can be any value from 0 to 90°; preferred values are from 45 to 90°.

By adjustment of the angles α and β, the separation of particles 115 from stripping solution 113 can be optimized with changing temperature, production rate, stripper composition, and other variables occurring in the production of PWBs which affect the composition of solution 111.

Insofar as it is understood, and not wishing to bound hereby, the method of this invention is theorized to operate as follows: Solution 111 from the resist-stripping step, comprising stripping solution 113 containing dispersed resist particles 115 of photopolymer removed from a PWB, is conveyed through solution-feed means 129 by pump 135 into curtain tube 101, and thereafter depends from outer concentric tube 105 through slot 109, and falls onto screen 121. Stripping solution 113 then passes through screen 121, leaving particles 115 on the upper surface of screen 121; the surface tension of stripping solution 113 maintains a slight film on the individual particles 115. Migration of particles appears to be caused by a sequential venturi effect, the bulk of stripping solution 113 running along the underside of screen 121, and causing each mesh opening to act as an individual vacuum pump before the filtered stripping solution 113 is directed by deflector 151 into storage means 131. Surprisingly, particulates separated by the method and apparatus of this invention do not clog screen 121. As noted, particulate material 115 remains on the upper surface of screen 121, and continues downwardly along screen 121 to fall into collector 123, although it is not understood why clogging does not occur.

Figure 5:
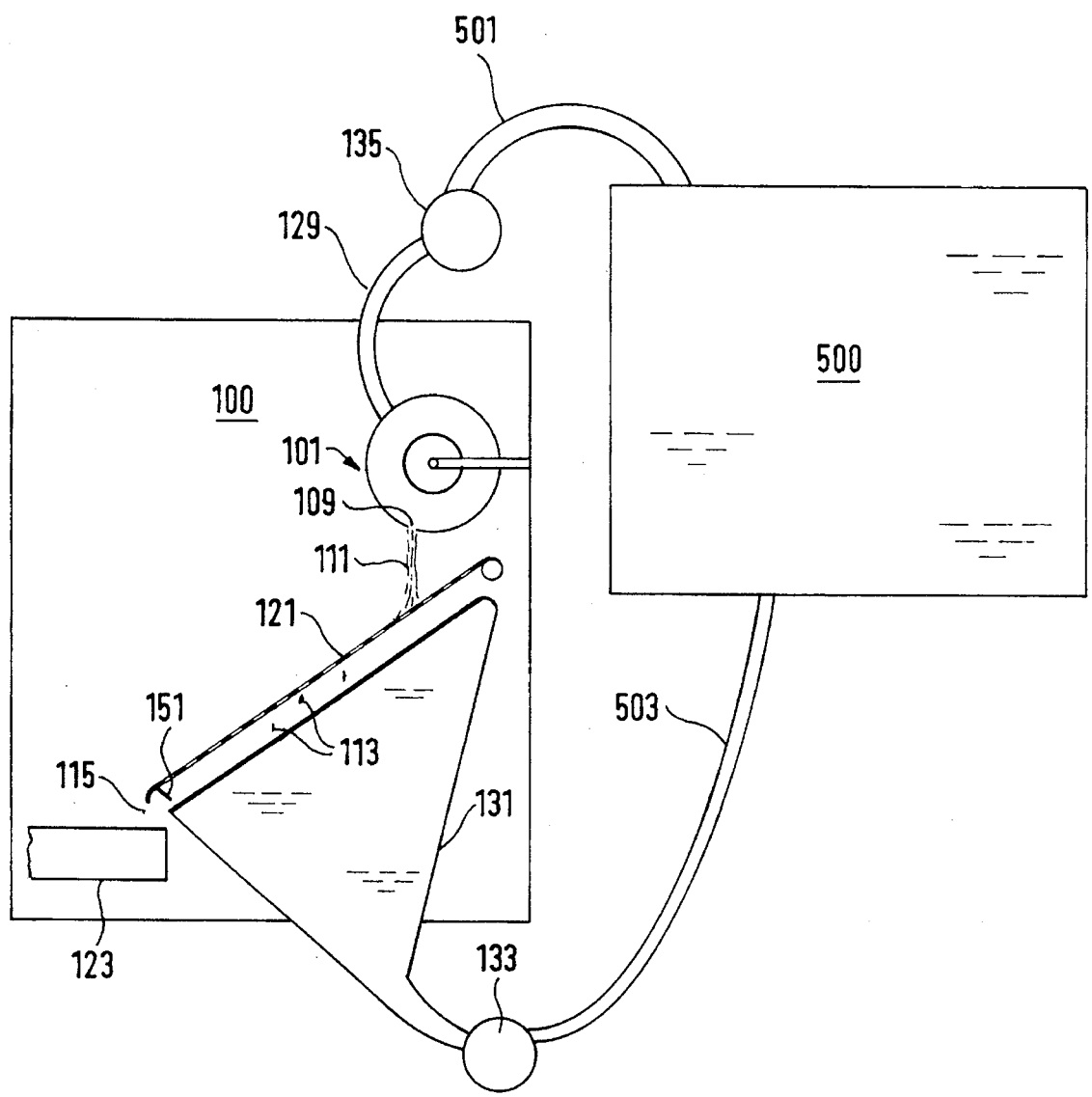
FIG. 5 shows the apparatus connected with stripping apparatus for PWBs.

The apparatus of this invention can be used in cooperation with apparatus for preparing a PWB and removal of resist particles. FIG. 5 shows the apparatus as described in FIG. 1, juxtaposed with apparatus 500, schematically representing stripping apparatus of the prior art. Stripping solution with resist particles dispersed therein is conveyed through solution-transport means 501 by the operation of motive means 135 to mixing and dispensing means 101, for treatment as described hereinabove with respect to FIG. 1. Filtered solution 113 is returned from storage means 131 by the operation of pump means 133 through solution-transport means 503 to apparatus 500 for further treatment of the PWB.

The following examples are illustrative, but not limiting, in demonstrating the utility of the present invention.

COMPARATIVE EXAMPLE

In the stripping operation of the method set forth above, a hydrocyclone filtration mechanism of the prior art is used to separate resist particles from the stripping medium. After about 40 hours of stripping with a 15 wt % aqueous solution of a mixture consisting of 75 wt % triethanolamine and 25 wt % NaOH at 50° C., separation of resist particles, and recirculation of the stripping medium, it is found necessary to discontinue operations in order to replace the used stripping solution with fresh solution.

EXAMPLE 1

A solution of 15 wt % of EDTA in water is prepared and used at 50° C. as the solution for the resist-stripping step. After removal of resist particles, the solution, comprising the liquid containing resist particles removed from a PWB, is conveyed into the curtain tube and thereafter depends from the outer concentric tube through the slot, and falls onto the screen. The filtered liquid is recycled to the stripping step; resist particles are thereafter discarded. After 480 hours of operation at 50° C. and repeated filtration and recycling, the stripping medium is unchanged in appearance and physical properties, and the stripping operation continues.

EXAMPLES 2 THROUGH 10

The method of Example 1 is repeated, using as the stripping solution materials comprising an aqueous solution selected from the group consisting of one or more compounds containing (1) at least one organoamine having the general molecular formula $(R_kN)_nC_qR_m$, where k is 1 or 2, n and m are integers from 1 to about 5, q is an integer from zero to about 5, R is hydrogen or hydroxyl, or substituted or unsubstituted alkyl, aryl or aralkyl of from 1 to about 10 carbon atoms, each R group in the molecule can be the same or different, there is at least one carbon-hydroxyl group in the molecule and the carbons are not necessarily catenated; (2) an ionic nitrogen compound having the general formula $[N_yR'_w]^+[A]^-$, where y is an integer from 1 to about 3, w is an integer from 4 to about 8, R' is hydrogen or hydroxyl, or substituted or unsubstituted alkyl, aryl or aralkyl of from 1 to about 10 carbon atoms, where substituents on the R' groups include halogen, hydrogen, hydroxyl and oxygen, and nitrogen- and sulfur-containing moieties, and each R group can be the same or different, and A is anionic; and (3) alkali-metal and alkaline-earth hydroxides.

The results obtained from each example were excellent; the stripping medium was visually unchanged, the removal of resist from the PWBs continued without observable diminution in its efficacy, and the discontinuance of operation of the system was necessary only to begin another test.

| Example No. | Stripping Medium | Solution Concentration, wt. % in water | Time of Operation, hours |
|---|---|---|---|
| 2 | KOH/(HOCH$_2$CH$_2$)$_3$N | 5/10 | 400 |
| 3 | Choline/(CH$_3$)$_3$N | 5/5 | 900 |
| 4 | (HOCH$_2$CH$_2$)NH$_2$ | 5 | 1200 |
| 5 | (HOCH$_2$CH$_2$)NH$_2$ | 40 | 800 |
| 6 | [(CH$_3$)$_4$N]$^+$[OH]$^-$ | 10 | 320 |
| 7 | (HOCH$_2$CH$_2$)$_3$N | 40 | 750 |
| 8 | EDTA | 35 | 700 |
| 9 | HO.C$_2$.NH.C$_2$H$_4$.NH$_2$ | 35 | 1000 |
| 10 | (HOCH$_2$)$_3$N | 40 | 850 |

The surprising utility of this invention has been demonstrated in its ability to effect the virtually total separation of stripping solution 113 and resist particles 115 on a continuous basis without the necessity of manual attention or ancillary mechanisms to maintain the separation function of the apparatus; the only requirements for attention are the periodic removal of resist particles 115 from storage means 123, and infrequent shutdown for cleaning of the entire system.

Figure 4:
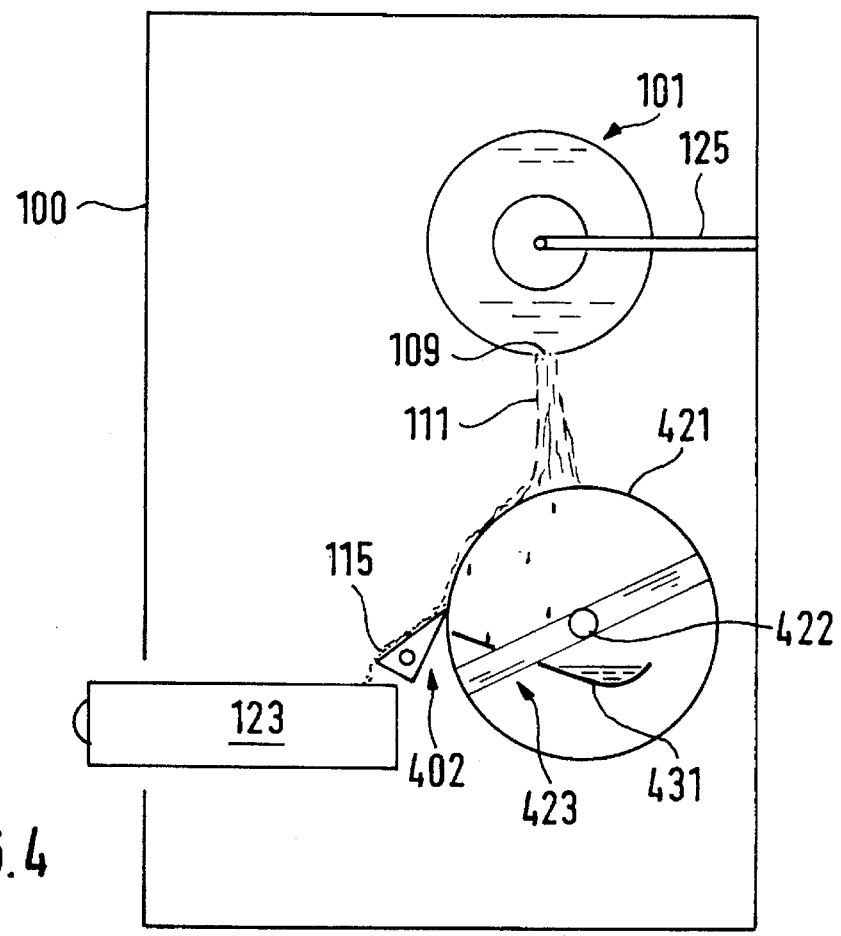
FIG. 4 shows an alternative embodiment of the apparatus.

In another embodiment of the invention, a moving cylindrical screen 421, affixed to axis 422 by mounts 423 as shown in FIG. 4, can be used in place of screen 121, in cooperation with a resist-removal means such as, e.g., a doctor blade 402 or the like, wherein the resist particles 115 are scraped off or otherwise removed from the screen surface rather than falling off upon reaching the lower edge of a flat screen. In FIG. 4, stripping solution 113 is shown falling onto a storage means, shown here as tray 431, from which it is then recirculated to the stripping process. The recirculation is achieved by means well known to those skilled in the art, such as, e.g., a pump, siphon or the like, which means form no part of this invention as such.

After resist particles 115 are removed from the surface of screen 421 and accumulated in storage means 123, they may then be disposed of appropriately after suitable treatment to minimize deleterious environmental impact.

Screen 121 or 421 most preferably has a mesh opening of about 100 μ, with a thread count of about 67 filaments per centimeter, and a thread diameter of about 50 μ; this construction provides an open area of about 45%. Variations of about 25% in the foregoing thread-count, thread-diameter and open-area values are within the scope and spirit of this invention, and will depend upon, e.g., the nature of the resist, the composition and viscosity of the stripping liquid, and the range of temperature of the liquid carrying the resist particles.

Irrespective of the embodiment of the method of this invention for particle removal, the resist particles are in contact with the solvent for only a minimal period, and the short dwell time permits repeated use of the stripping medium without its becoming substantially loaded with resist, and thus losing its utility to remove resist from the PWB.

The separation of resist particles 115 from the stripping solution by the method of the present invention is greater than 99.5%; i.e., less than about 0.5% of the resist particles originally present in solution 111 pass through screen 121 with stripping solution 113, and remain in solution. Therefore, only an extremely small proportion of the removed resist polymer stays in the stripping solution, and the solution remains active and useful in removing resist from a PWB for a much longer time than is attainable with the methods of the prior art.

Another embodiment of the present invention comprises, in combination, apparatus for stripping a PWB, the stripping apparatus having affixed thereto, or integral therewith, apparatus for the continuous removal of stripped resist particles wherein the apparatus comprises pump means, mixing and dispensing means comprising a curtain tube, the curtain tube consisting of an inner concentric tube with a plurality of holes and an outer concentric tube having a slot wherein the position of the slot is adjustable, the inner concentric tube being affixed within the outer concentric tube. Liquid passing through the mixing and dispensing means impinges on filter means; particulates are separated from the stripping solution by passage of the stripping solution over and through the filter means. Recirculation means such as, e.g., a pump, are adapted to return stripping solution, from which resist particles have been removed, to the apparatus for removing resist from the PWB. The operation of removing resist particles from the PWB by a stripping solution in the stripping apparatus, circulating the stripping solution through the curtain tube, filtering resist particles out, and recirculating the filtered solution is thus continuous with the combined apparatus.

In the continuous, three-shift operation with the method and apparatus of the present invention, PWB stripping operations can run indefinitely without the need to shut the line down for maintenance of the apparatus or to replace spent stripping solution.

What is claimed is:

1. Apparatus for the continuous removal of cured resist particles dispersed in a liquid stripping solution for a printed wire board, the apparatus comprising, in combination, means for contacting a treated printed wire board with a stripping solution, solution-movement means for urging the dispersion through a juxtaposed and fluidly connected curtain tube, the dispersion with resist particles dispersed therein depending from the curtain tube, wherein the tube comprises an inner concentric tube with a plurality of holes and an outer concentric tube having a slot, wherein the position of the slot is adjustable, the inner concentric tube being affixed within the outer concentric tube, and thereafter impinging on filter means whereby the resist particles are separated from the liquid stripping solution, the liquid stripping solution being collected in juxtaposed storage means, and recirculation means in fluid connection with the storage means adapted to return filtered stripping solution continuously to the contacting means.

2. The apparatus of claim 1 wherein the angle formed by the intersection of a line passing through the centerline of the slot with a line passing through the centerline of the outer concentric tube forms an angle of from about 45 to about 90° with the vertical.

3. The apparatus of claim 1 wherein the filter means comprises a screen.

4. The apparatus of claim 1 wherein the filter means comprises a flat screen forming an angle of from about 35 to about 85° with the horizontal.

5. The apparatus of claim 1 wherein the filter means comprises a cylindrical screen.

6. The apparatus of claim 1 further having disposal means for resist particles.

7. The apparatus of claim 1 wherein the filter means comprises a screen having mesh openings of from about 60 to 250 microns.

8. The apparatus of claim 7 wherein the screen has a mesh opening of from about 75 to about 125 microns, a thread count of from about 50 to about 85 filaments per centimeter, and a thread diameter of from about 35 to about 65 microns.

9. An apparatus for the separation of particulates from a liquid dispersion thereof which comprises curtain tube means for forming and dispensing a homogeneous dispersion of particulates in the liquid, the curtain tube means comprising an inner tube with a plurality of holes therein and an outer concentric tube having a dispensing slot therein, filter screen separator means disposed below the dispensing slot in the curtain tube means and located to receive the homogeneous dispersion dispensed therefrom, the screen separator means maintained at an angle to the horizontal whereby substantially only gravity causes the liquid to separate from the particulates and causes the particulates to proceed downwardly along the filter screen separation means, and means for separately recovering the liquid and the particulates.

10. An apparatus according to claim 9 in which the filter screen separator means is maintained at an angle of from about 35° to about 85° to the horizontal.

11. An apparatus according to claim 9 in which the filter screen separator means is maintained at an angle of from about 50° to about 55° to the horizontal.

12. An apparatus according to claim 9 including solution-movement means for urging the liquid dispersion through the curtain tube means.

13. An apparatus according to claim 9 including storage means for the recovered liquid.

14. An apparatus according to claim 9 in which the filter screen separator means comprises a cylindrical screen.

15. An apparatus for the continuous removal of cured resist particles from a dispersion thereof in a liquid stripping solution which comprises a curtain tube means for forming and dispensing a homogeneous dispersion of resist particles in the liquid stripping solution, the curtain tube means comprising an inner tube with a plurality of holes therein and an outer concentric tube having a dispensing slot therein, solution-movement means for urging the dispersion of resist particles in stripping solution through the curtain tube means and out the dispensing slot, filter screen separator means below the curtain tube dispensing slot and located to receive the homogeneous dispersion dispensed therefrom, the filter screen separator means maintained at an angle to the horizontal whereby substantially only gravity causes the liquid stripping solution to separate from the resist particles and causes the particulates to proceed downwardly along the filter screen separator means, and means for separately recovering the resist particles and the liquid stripping solution.

16. An apparatus according to claim 15 including means for recycling the recovered liquid stripping solution.

17. An apparatus according to claim 15 in which the filter screen separator means is maintained at an angle of from about 35° to about 85° to the horizontal.

18. An apparatus according to claim 15 in which the filter screen separator means is maintained at an angle of from about 50° to about 55° to the horizontal.

19. An apparatus according to claim 15 in which the filter screen separator means comprises a screen having mesh openings of from about 60 to 250 microns.

20. An apparatus according to claim 15 in which the filter screen separator comprises a screen having a mesh opening of from about 75 to 125 microns, a thread count of from about 50 to about 85 filaments per centimeter and a thread diameter of from about 35 to about 65 microns.

* * * * *